(12) United States Patent
Lin et al.

(10) Patent No.: US 6,300,248 B1
(45) Date of Patent: Oct. 9, 2001

(54) ON-CHIP PAD CONDITIONING FOR CHEMICAL MECHANICAL POLISHING

(75) Inventors: Chih-Lung Lin, Taipei; Pei-Yu Chen, Long-Tai, both of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/366,227

(22) Filed: Aug. 3, 1999

(51) Int. Cl.$^7$ .................................................. H01L 21/302
(52) U.S. Cl. ........................ 438/692; 438/691; 438/693
(58) Field of Search ................... 216/41, 51, 67, 216/79; 451/41; 438/14, 692, 691, 693

(56) References Cited

U.S. PATENT DOCUMENTS 5,755,979 * 5/1998 Appel et al. ............................ 216/41

* cited by examiner

*Primary Examiner*—Roy Potter
(74) *Attorney, Agent, or Firm*—Tung & Associates

(57) ABSTRACT

A method for on-chip polishing pad conditioning in a chemical mechanical polishing process is disclosed. In the method, a plurality of dummy patterns in a designated area on a wafer surface are planted during the same photolithographic method for forming the IC dies. The designated area may be the edge portion, i.e., the blanket area along the edges of a wafer, or the scribe lines formed on the wafer. The dummy patterns should be formed to a step height of at least 2,000 Å, and preferably to at least 4,000 Å. The present invention plurality of dummy patterns is used during a polishing process for the top surface of a semiconductor wafer by a polishing pad. The plurality of dummy patterns simultaneously conditions the pad in a localized manner to improve the removal rate of the pad. The shape of the dummy patterns can be formed in any desirable shape, including those that have a cross-section of a square or a rectangle with a width of at least 100 Å.

15 Claims, 5 Drawing Sheets

ON-CHIP PAD CONDITIONING FOR CHEMICAL MECHANICAL POLISHING

FIELD OF THE INVENTION

The present invention generally relates to a method for polishing pad conditioning in a chemical mechanical polishing process and more particularly, relates to a method for on-chip polishing pad conditioning in a chemical mechanical polishing process by incorporating built-in dummy patterns on a semiconductor wafer wherein the patterns have a thickness of at least 2,000 Å for supplementing localized conditioning of the polishing pad.

BACKGROUND OF THE INVENTION

Apparatus for polishing thin, flat semiconductor wafers is well-known in the art. Such apparatus normally includes a polishing head which carries a membrane for engaging and forcing a semiconductor wafer against a wetted polishing surface, such as a polishing pad. Either the pad, or the polishing head is rotated and oscillates the wafer over the polishing surface. The polishing head is forced downwardly onto the polishing surface by a pressurized air system or, similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head; a wafer unload station; or, a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

A schematic of a typical CMP apparatus is shown in FIGS. 1A and 1B. The apparatus 10 for chemical mechanical polishing consists of a rotating wafer holder 14 that holds the wafer 10, the appropriate slurry 24, and a polishing pad 12 which is normally mounted to a rotating table 26 by adhesive means. The polishing pad 12 is applied to the wafer surface 22 at a specific pressure. The chemical mechanical polishing method can be used to provide a planar surface on dielectric layers, on deep and shallow trenches that are filled with polysilicon or oxide, and on various metal films. CMP polishing results from a combination of chemical and mechanical effects. A possible mechanism for the CMP process involves the formation of a chemically altered layer at the surface of the material being polished. The layer is mechanically removed from the underlying bulk material. An altered layer is then regrown on the surface while the process is repeated again. For instance, in metal polishing, a metal oxide may be formed and removed repeatedly.

A polishing pad is typically constructed in two layers overlying a platen with the resilient layer as the outer layer of the pad. The layers are typically made of polyurethane and may include a filler for controlling the dimensional stability of the layers. The polishing pad is usually several times the diameter of a wafer and the wafer is kept off-center on the pad to prevent polishing a non-planar surface onto the wafer. The wafer is also rotated to prevent polishing a taper into the wafer. Although the axis of rotation of the wafer and the axis of rotation of the pad are not collinear, the axes must be parallel. Polishing heads of the type described above used in the CMP process are shown in U.S. Pat. Nos. 4,141,180 to Gill, Jr., et al.; U.S. Pat. No. 5,205,082 to Shendon et al; and, U.S. Pat. No. 5,643,061 to Jackson, et al. It is known in the art that uniformity in wafer polishing is a function of pressure, velocity and the concentration of chemicals. Edge exclusion is caused, in part, by a non-uniform pressure applied on a wafer. The problem is reduced somewhat through the use of a retaining ring which engages the polishing pad, as shown in the Shendon et al patent.

Referring now to FIG. 1C, wherein an improved CMP head, sometimes referred to as a Titan® head which differs from conventional CMP heads in two major respects is shown. First, the Titan® head employs a compliant wafer carrier and second, it utilizes a mechanical linkage (not shown) to constrain tilting of the head, thereby maintaining planarity relative to a polishing pad 12, which in turn allows the head to achieve more uniform flatness of the wafer during polishing. The wafer 10 has one entire face thereof engaged by a flexible membrane 16, which biases the opposite face of the wafer 10 into face-to-face engagement with the polishing pad 12. The polishing head and/or pad 12 are moved relative to each other, in a motion to effect polishing of the wafer 10. The polishing head includes an outer retaining ring 14 surrounding the membrane 16, which also engages the polishing pad 12 and functions to hold the head in a steady, desired position during the polishing process. As shown in FIG. 1C, both the retaining ring 14 and the membrane 16 are urged downwardly toward the polishing pad 12 by a linear force indicated by the numeral 18 which is effected through a pneumatic system.

The polishing pad 12 is a consumable item used in a semiconductor wafer fabrication process. For instance, under normal wafer fab conditions, the polishing pad must be replaced after a usage of between 12 and 18 hours. Polishing pads may be hard, incompressible pads or soft pads. For oxide polishing, hard, incompressible and thus stiffer pads are generally used to achieve planarity. Softer pads are frequently used to achieve improved uniformity and smooth surfaces. The hard pads and the soft pads may also be combined in an arrangement of stacked pads for customized applications.

A problem frequently encountered in using polishing pads in a CMP process for oxide planarization is the rapid deterioration in polishing rates of the oxide with successive wafers. The cause for the deterioration has been shown to be due to an effect known as "pad glazing" wherein the surface of the polishing pads become smooth such that the pads can no longer hold slurry in-between the fibers. This has been found to be a physical phenomenon on the surface, and is not caused by any chemical reactions between the pad and the slurry.

To remedy the pad glazing effect, numerous techniques of pad conditioning or scrubbing have been proposed to regenerate and restore the pad surface and thereby, restoring the polishing rates of the pad. The pad conditioning techniques include the use of silicon carbide particles, diamond emery paper, blade or knife for scrapping the polishing pad surface. The goal of the conditioning process is to remove polishing debris from the pad surface, reopen the pores, and thus forms micro scratches in the surface of the pad for improved life time of the pad surface. The pad conditioning process can be carried out either during a polishing process, i.e., known as concurrent conditioning, or after a polishing process.

While the pad conditioning process improves pad consistency and its lifetime, conventional apparatus of a conditioning disk is frequently not effective in conditioning a pad surface. For instance, a conventional conditioning disk for use in pad conditioning is shown in FIGS. 1A and 1B. The conditioning disk 30 is formed by embedding or encapsulating diamond particles 32 in nickel 34 coated on the surface 36 of a rigid substrate 38. FIG. 1A is a cross-sectional view of a new conditioning disk with all the diamond particles 32, 42 embedded in nickel 34. After repeated usage as a conditioning disk, the cross-sectional view of the disk 30 is shown in FIG. 1B which shows that diamond particle 42 has been lost and the top surfaces of the remaining particles 32 are flattened. The loss of diamond particle from nickel encapsulation 34 occurs frequently when the particle is not deeply embedded in the nickel metal 34. In the fabrication of the diamond particle conditioning disk 30, a nickel encapsulation 34 is first mixed with a diamond grid which included the diamond particles 32, 42 and applied to the rigid substrate 38. The bonding of the diamond particles 32, 42 is frequently insecure and thus the particles are easily lost from the nickel coating during usage.

It is therefore an object of the present invention to provide a method for polishing pad conditioning in a chemical mechanical polishing process that does not have the drawbacks or shortcomings of the conventional conditioning methods.

It is another object of the present invention to provide an on-chip conditioning method for use in a chemical mechanical polishing process.

It is a further object of the present invention to provide a polishing pad conditioning method for a chemical mechanical polishing process that supplements conventional in-situ or ex-situ conditioning by diamond disks.

It is another further object of the present invention to provide a method for polishing pad conditioning for a chemical mechanical polishing process in which dummy patterns are formed on the wafer that have a step height of at least 2,000 Å.

It is still another object of the present invention to provide a method for polishing pad conditioning for a chemical mechanical polishing process by forming a plurality of dummy pasterns in the same photolithographic process that is used for forming the IC dies.

It is yet another object of the present invention to provide a method for conditioning a polishing pad during a polishing process by photolithographically forming IC dies in a first area and dummy patterns in a second area on a top surface of a wafer prior to the polishing process.

It is still another further object of the present invention to provide a method for conditioning a polishing pad during a chemical mechanical polishing process by forming IC dies in a center region of the wafer and dummy patterns in an edge portion or at scribe lines on the wafer prior to the polishing process.

It is yet another further object of the present invention to provide a semiconductor wafer that has an active surface and a plurality of dummy patterns formed on the active surface for on-chip conditioning during a chemical mechanical polishing process.

SUMMARY OF THE INVENTION

In accordance with the present invention, a method for on-chip pad conditioning in a chemical mechanical polishing process is provided which utilizes a semiconductor wafer that has an active surface and a plurality of dummy patterns formed on the active surface for on-chip conditioning during a CMP process.

In a preferred embodiment, a method for on-chip pad conditioning in a chemical mechanical polishing process can be carried out by the operating steps of providing a top surface of a semiconductor wafer that has a first area not formed with IC dies, forming dummy patterns in the first area to a step height of at least 2,000 Å, and polishing the top surface of the semiconductor wafer by a polishing pad and simultaneously conditioning the pad in a localized manner by the dummy patterns.

The method for on-chip pad conditioning in a chemical mechanical polishing process may further include the step of forming the dummy patterns in the first area to a step height of preferably at least 4,000 Å. The method may further include the step of forming the dummy patterns in an edge area on the top surface of the wafer. The method may further include the step of forming the dummy patterns in a scribe line area on the top surface of the wafer. The method may further include the step of forming the dummy patterns in square cross-sections each having a width of at least 100 Å. The method may further include the step of selecting a density of the dummy patterns for controlling the localized conditioning effect. The method may still further include the step of selecting a step height of the dummy patterns for controlling the localized conditioning effect.

In an alternate embodiment, the present invention discloses a method for conditioning a polishing pad during a polishing process which includes the steps of providing a semiconductor wafer which has a top surface, photolithographically forming IC dies in a first area and dummy patterns in a second area on the top surface of the wafer, and intimately engaging the top surface of the wafer to a top surface of a polishing pad for planarizing the top surface of the wafer and for simultaneously conditioning the top surface of the polishing by the dummy patterns.

In the method for conditioning a polishing pad during a polishing process, the method may be an on-chip pad conditioning method. The first area may be a center region on the wafer while the second area may be an edge portion on the wafer, or a scribe line on the wafer. The method may further include the step of forming the dummy patterns in the second area to a step height of not less than 2,000 Å, and preferably not less than 4,000 Å. The method may further include the step of forming the dummy patterns in the second area in square cross-sections each having a width of not less than 100 Å. The method may further include the step of forming the dummy patterns in the second area in silicon oxide.

The present invention is further directed to a semiconductor wafer which has an active surface and a plurality of dummy patterns formed on the active surface for on-chip conditioning during a CMP process that includes an active surface on top of the semiconductor wafer, a first region on the active surface formed with IC dies, and a second region on the active surface formed with a plurality of dummy patterns.

In the semiconductor wafer that has an active surface and a plurality of dummy patterns formed on the active surface, the first region on the active surface may be at the center of the wafer, while the second on the active surface may be at the edge portion or at the scribe lines on the wafer. The plurality of dummy patterns may be formed with a minimum height of 2,000 Å and a minimum width of 100 Å.

BRIEF DESCRIPTION OF THE DRAWINGS

These and other objects, features and advantages of the present invention will become apparent from the following detailed description and the appended drawings in which.

DETAILED DESCRIPTION OF THE EMBODIMENT

The present invention discloses a method for on-chip pad conditioning for use in a chemical mechanical polishing method. The on-chip pad conditioning method can be used advantageously to replace the conventional in-situ or ex-situ conditioning by using diamond disks. When the conventional in-situ or ex-situ conditioning method by using diamond disk is utilized, a global conditioning effect is seen on the polishing pad. The present invention novel method of implanting dummy patterns on certain areas of a wafer can induce the on-chip conditioning effect, or a localized conditioning effect on the wafer and at specific areas.

By utilizing the present invention novel method, the thickness uniformity after a polishing process can be achieved especially at local low polishing rate areas. The present invention novel method therefore enhances planarization efficiency.

Figure 4:
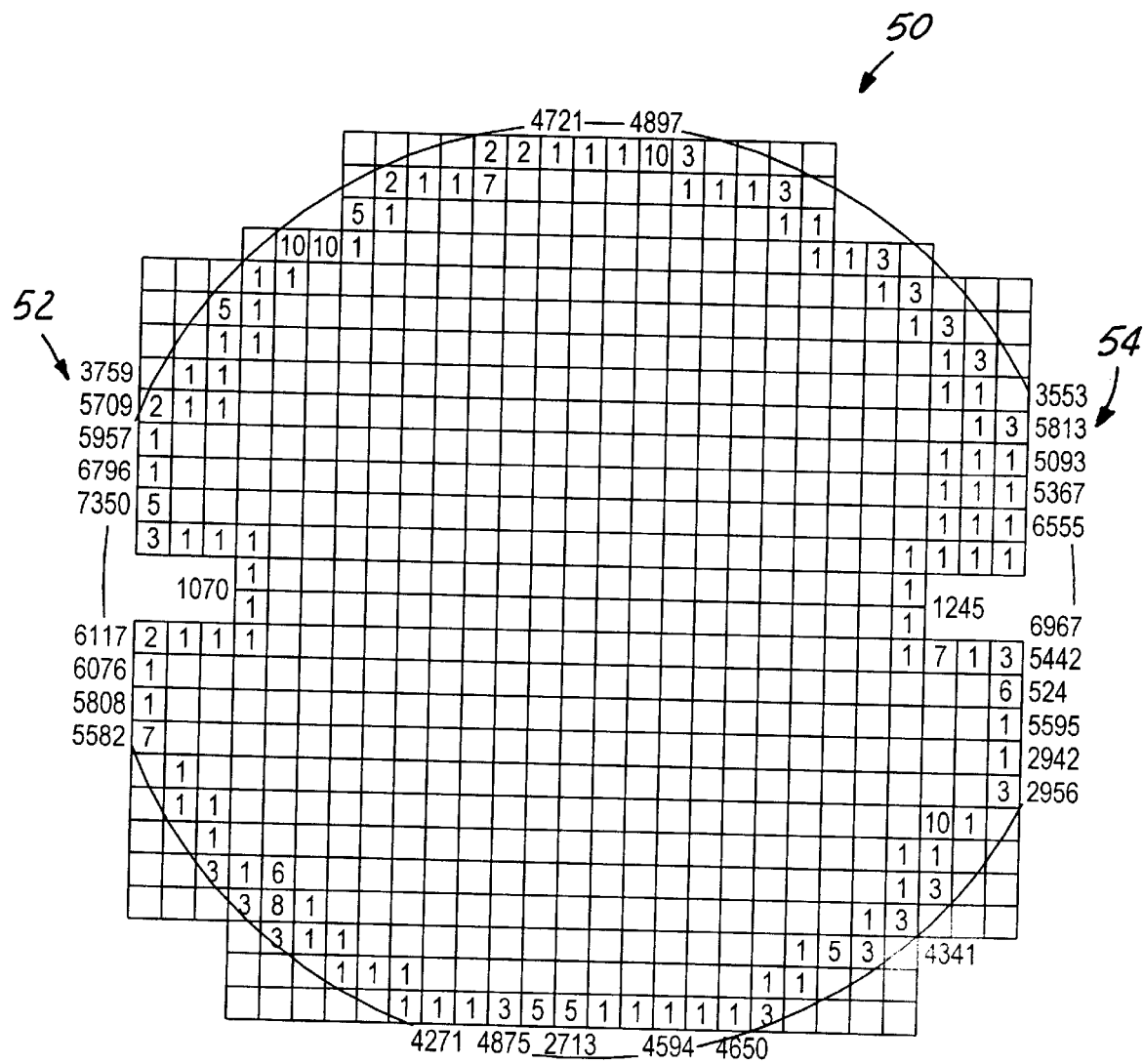
FIG. 4 is a grid view of a conventional wafer conditioned by conventional pad conditioning methods.

In a CMP process, conditioning of the polishing pad is necessary in order to activate the pad surface to achieve constant polishing rate. In-situ or ex-situ conditioning is frequently performed by using diamond disks and thus inducing a global conditioning effect on the pad and steady polishing rate on the entire wafer. However, certain areas on a wafer surface always have low polishing rates due to a pattern effect. This causes local poor planarization and poor within-wafer polishing uniformity. For instance, during a CMP process, not only the wafer is polished by the polishing pad, the wafer surface also shows a local conditioning effect caused by the IC dies on the surface of the wafer. For instance, in areas between IC dies and in blanket areas along the edge portion of the wafer, it is difficult to polish and thus a low removal rate is normally achieved. The blanket area removal rate is low, and therefore the total removal rate for the wafer is lower. This is shown in FIG. 4 for a wafer 50 with IC grid formed on a top active surface. Along the two edge portions 52, 54, the removal rate of the silicon dioxide insulating layer in a CMP process is significantly lower than the center portion of the wafer. For instance, at edge portion 52, a total thickness of the silicon oxide layer left is between about 5,000 and about 7,000 Å. Similar thicknesses of silicon oxide layers are also left on the wafer edge portion 54.

Figure 1A:
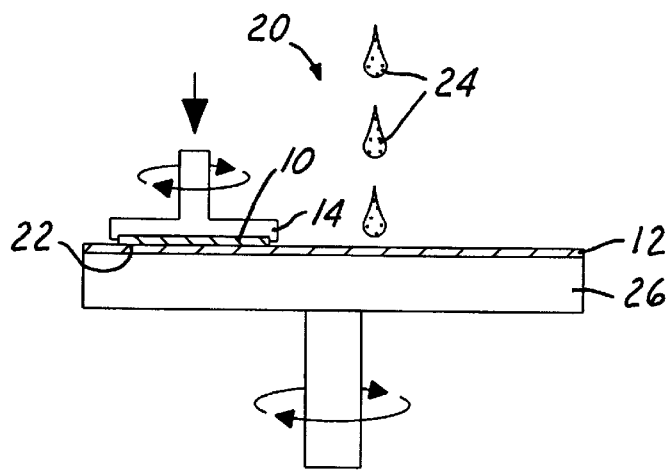
FIG. 1A is a schematic of a cross-sectional view of a conventional chemical mechanical polishing apparatus.
Figure 1B:
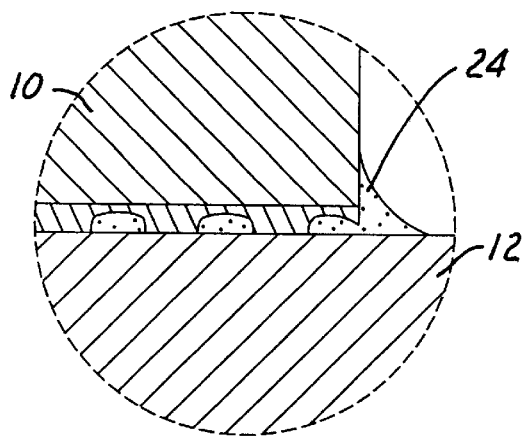
FIG. 1B is an enlarged, partial cross-sectional view of the wafer and the polishing pad shown in FIG. 1A.
Figure 1C:
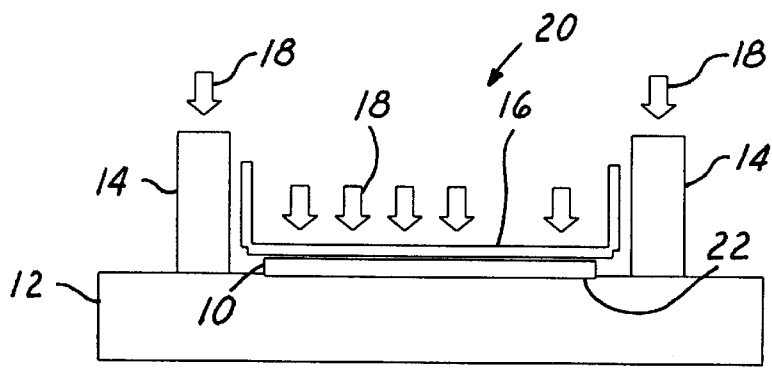
FIG. 1C is a cross-sectional view of an improved polishing head for a CMP apparatus.
Figure 2A:
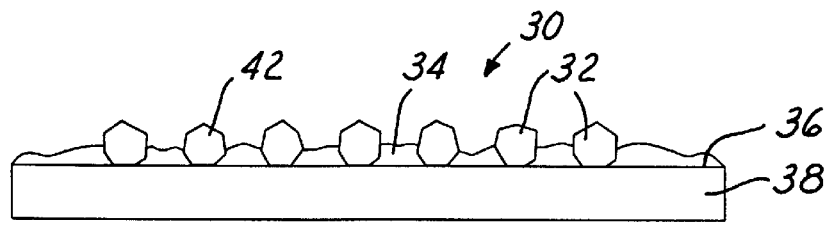
FIG. 2A is a cross-sectional view of a conventional conditioning disk formed of a diamond grid coated on a rigid substrate before usage.
Figure 2B:
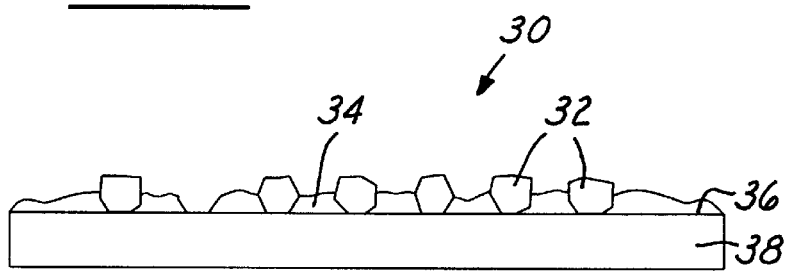
FIG. 2B is a cross-sectional view of the conditioning disk of FIG. 2A after usage and after a diamond particle is lost from the encapsulated surface.
Figure 5:
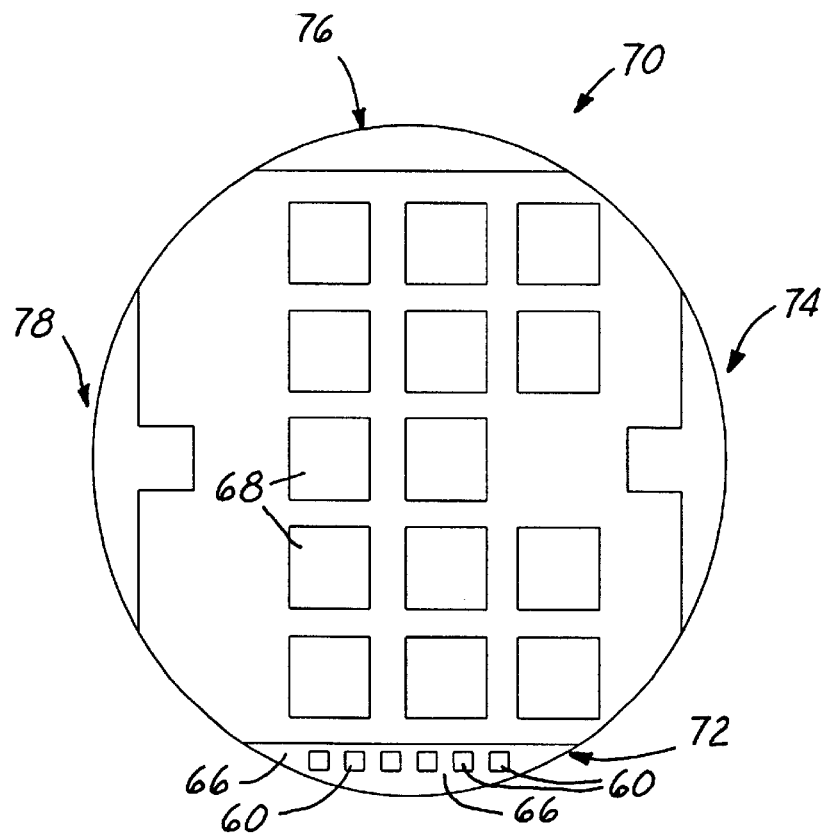
FIG. 5 is an enlarged, partial illustration of a present invention silicon wafer having dummy patterns formed in an edge portion of the wafer.
Figure 3:
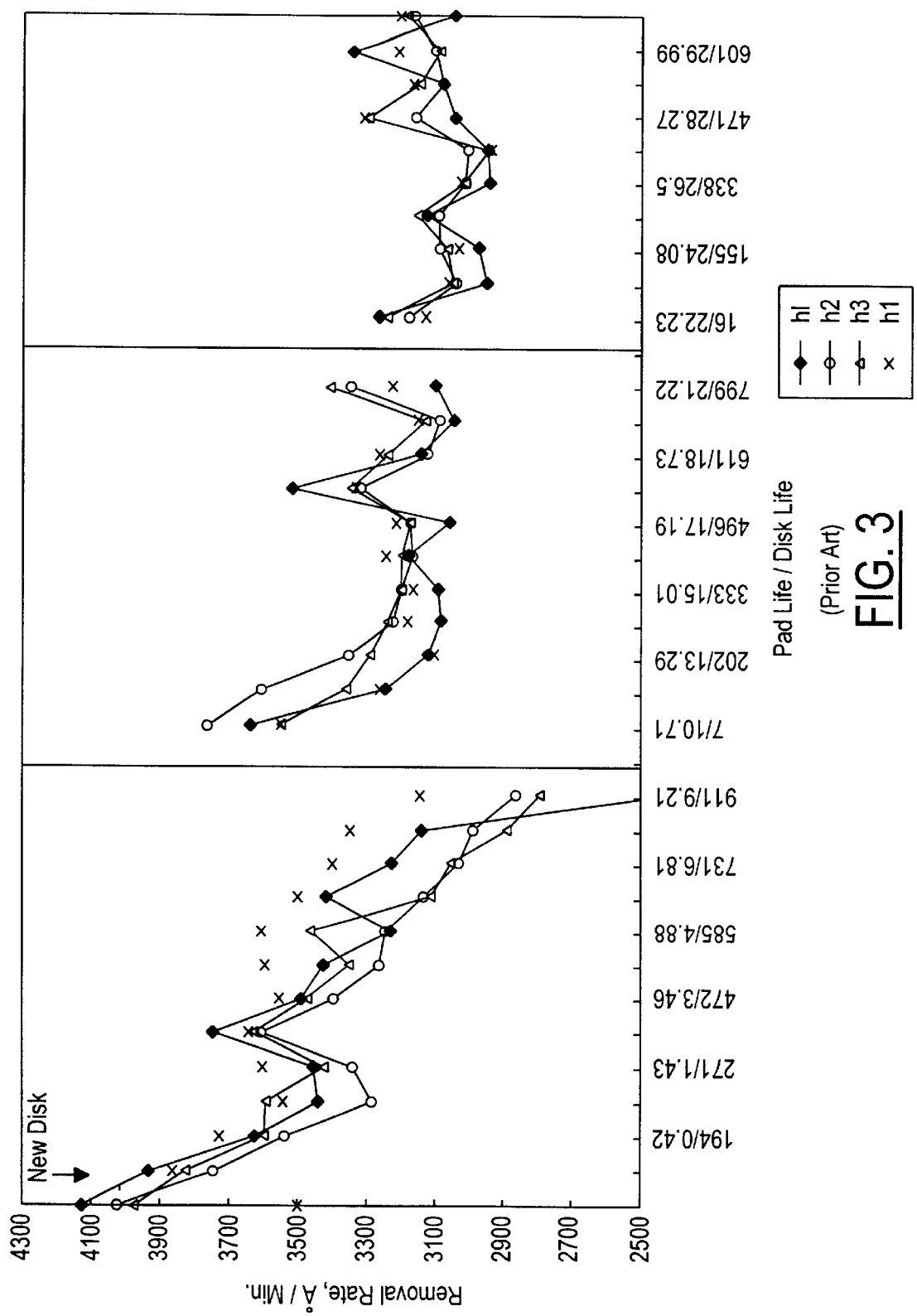
FIG. 3 is a graph illustrating the deterioration in removal rates after successive usage of a polishing pad that is conditioned by a conventional conditioning disk of diamond grid.

The present invention novel plurality of dummy patterns 60 are utilized, as shown in FIG. 5, on wafer 70 in an edge portion 72. Similarly, the plurality of dummy patterns 60 is also formed in the edge portion 74, 76 and 78. It should be noted that, for simplicity reasons, the plurality of dummy patterns are not shown in those edge portions. It should also be noted that the edge portion, also known as the blanket area, is not the only area where the plurality of dummy patterns can be built. The plurality of dummy patterns may also be implanted along the scribe lines on a wafer to achieve the same desirable result. The formation of plurality of dummy patterns 60 can be advantageously achieved in the same photolithographic step for forming the IC dies 68. In one embodiment, the dummy pattern is formed to a step height, defined as the height of the dummy pattern 60 over the blanket area 66, of at least 2,000 Å. It is preferred that the step height of the dummy patterns 60 should be at least 4,000 Å in order to achieve the desirable localized conditioning effect. The cross-sectional shape of the plurality of dummy patterns 60 is not important. As shown in FIG. 5, in one of many possible configurations, squares are formed which have a width of at least 100 Å. Other dummy patterns in rectangular shapes or any other desirable shapes may also be used to achieve the same desirable result.

The present invention novel method can be carried out by first adding dummy patterns to the wafer surface, i.e., preferably in the edge portions of the wafer by the same photolithographic process during which the IC dies are formed. The dummy patterns can be formed with different step heights, up to 4,000~5,000 Å higher than the blanket area. The dummy patterns may further be formed along any scribe lines on the surface of the wafer. The dummy patterns create a localized conditioning effect to enhance or improve the polishing rate or the removal rate by the polishing pad. The density of the dummy patterns formed and the step height of each dummy pattern may be suitably selected such that the localized conditioning effect can be suitably controlled.

The present invention novel method solves problems that normally occur at low polishing rate areas such as blanket areas or peripheral areas on a wafer. By utilizing the present invention novel method, the step height difference between a wafer center area and a wafer edge area caused by different removal rates and the subsequent photo misalignment problem are largely avoided. Furthermore, the present invention novel method eliminates a poor planarization process across a peripheral area to the scribe lines.

The present invention dummy pattern can be fabricated of any size and with any step height, up to approximately 5,000 Å. The dummy patterns induce conditioning effect, or localized conditioning effect on the polishing pad. The dummy patterns therefore determine local conditioning areas and enhance polishing rates at such areas. The localized conditioning effect on the polishing pad may further be determined by the density and step height of the dummy patterns.

The dummy patterns used in the present invention novel method may further be planted on the scribe lines on a wafer surface. A scribe line area is similar to a blanket area on the wafer surface, since at or near the scribe lines there are no IC dies but only silicon oxide insulating layers. At the scribe lines, similar removal rate problem to that occurring in the edge portions or in the blanket areas exists, i.e., it is more difficult to remove silicon oxide from the scribe line areas. The difficulty frequently results in step height problems. The present invention dummy cells may be formed in the middle of scribe lines to improve the planarization efficiency. Since the thickness of initial deposition of the silicon oxide insulating layers can be reduced, i.e., in order to achieve planarization, the present invention method increases polishing efficiency at difficult to polish areas by using the dummy patterns for localized pad conditioning. The desirable result of the present invention novel method can be seen in FIG. 6. A present invention wafer 70 is shown with edge portions 82 and 84 measured for step heights. It is seen that when compared to the edge portions 52, 54 as shown in FIG. 4, the local thicknesses of the insulating layer is at least 1,000 Å smaller which indicates a significantly improved removal rate, or a significantly more efficient polishing process due to the use of the present invention dummy patterns for pad conditioning. For simplicity reasons the location of the dummy patterns used on wafer 70 is not shown in FIG. 6.

Figure 6:
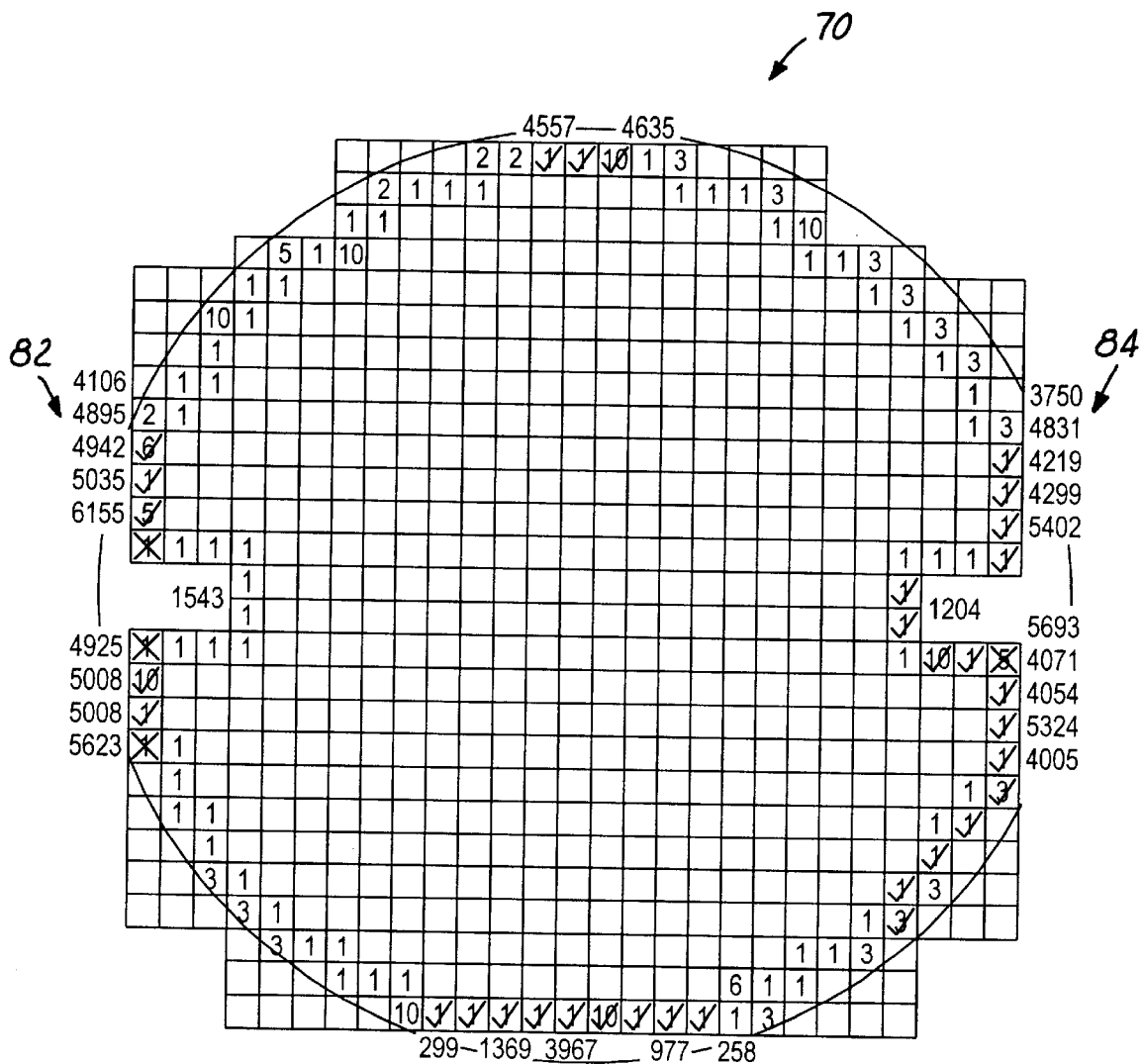
FIG. 6 is a grid pattern of a silicon wafer similar to FIG. 4 except that the present invention novel on-chip conditioning method was utilized.

The present invention novel method of on-chip polishing pad conditioning for use in a chemical mechanical polishing process has therefore been amply described in the above descriptions and in the appended drawings of FIGS. 5 and 6.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for on-chip pad conditioning in a chemical mechanical polishing (CMP) process comprising the steps of:
   providing a top surface of a semiconductor wafer having a first area not formed with IC dies,
   forming dummy patterns in said first area to a step height of at least 2000 Å, and
   polishing said top surface of the semiconductor wafer by a polishing pad and simultaneously conditioning the pad in a localized manner by said dummy patterns.

2. A method for on-chip pad conditioning in a CMP process according to claim 1 further comprising the step of forming said dummy patterns in said first area to a step height of at least 4,000 Å.

3. A method for on-chip pad conditioning in a CMP process according to claim 1 further comprising the step of forming said dummy patterns in an edge area on said top surface of the wafer.

4. A method for on-chip pad conditioning in a CMP process according to claim 1 further comprising the step of forming said dummy patterns in a scribe line area on said top surface of the wafer.

5. A method for on-chip pad conditioning in a CMP process according to claim 1 further comprising the step of forming said dummy patterns in square cross-sections each having a width of at least 100 Å.

6. A method for on-chip pad conditioning in a CMP process according to claim 1 further comprising the step of selecting a density of said dummy patterns for controlling said localized conditioning effect.

7. A method for on-chip pad conditioning in a CMP process according to claim 1 further comprising the step of selecting a step height of said dummy patterns for controlling said localized conditioning effect.

8. A method for conditioning a polishing pad during a polishing process comprising the steps of:
   providing a semiconductor wafer having a top surface,
   photolithographically forming IC dies in a first area and dummy patterns in a second area on said top surface of the wafer, and
   intimately engaging said top surface of the wafer to a top surface of a polishing pad for planarizing said top surface of the wafer and for simultaneously conditioning said top surface of the polishing pad by said dummy patterns.

9. A method for conditioning a polishing pad during a polishing process according to claim 8, wherein said method is an on-chip pad conditioning method.

10. A method for conditioning a polishing pad during a polishing process according to claim 8, wherein said first area being a center region of said wafer and said second area being an edge portion of said wafer.

11. A method for conditioning a polishing pad during a polishing process according to claim 8, wherein said first area being a center region of said wafer and said second area being a scribe line region of said wafer.

12. A method for conditioning a polishing pad during a polishing process according to claim 8 further comprising the step of forming said dummy patterns in said second area to a step height of not less than 2,000 Å.

13. A method for conditioning a polishing pad during a polishing process according to claim 8 further comprising the step of forming said dummy patterns in said second area to a step height of not less than 4,000 Å.

14. A method for conditioning a polishing pad during a polishing process according to claim 8 further comprising the step of forming said dummy patterns in said second area in square cross-sections having a width of not less than 100 Å.

15. A method for conditioning a polishing pad during a polishing process according to claim 8 further comprising the step of forming said dummy patterns in said second area in silicon oxide.

* * * * *